(12) United States Patent
Wang et al.

(10) Patent No.: US 7,977,722 B2
(45) Date of Patent: Jul. 12, 2011

(54) NON-VOLATILE MEMORY WITH PROGRAMMABLE CAPACITANCE

(75) Inventors: Xuguang Wang, Maple Grove, MN (US); Shuiyuan Huang, Apple Valley, MN (US); Dimitar V. Dimitrov, Edina, MN (US); Michael Xuefei Tang, Bloomington, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 390 days.

(21) Appl. No.: 12/123,662

(22) Filed: May 20, 2008

(65) Prior Publication Data

US 2009/0289290 A1    Nov. 26, 2009

(51) Int. Cl.
*H01L 29/92*    (2006.01)
(52) U.S. Cl. ........ 257/300; 257/296; 257/298; 257/306; 257/312; 257/E29.345
(58) Field of Classification Search .................. 257/300, 257/296, 298, 306, 312, E29.345
See application file for complete search history.

(56) References Cited

U.S. PATENT DOCUMENTS

| | | | |
|---|---|---|---|
| 5,761,115 A * | 6/1998 | Kozicki et al. ................. | 365/182 |
| 6,894,304 B2 | 5/2005 | Moore | |
| 6,903,361 B2 | 6/2005 | Gilton | |
| 7,116,577 B2 | 10/2006 | Eitan | |
| 7,169,635 B2 | 1/2007 | Kozicki | |
| 7,202,520 B2 | 4/2007 | Gilton | |
| 7,276,722 B2 | 10/2007 | Gilton | |
| 7,282,783 B2 | 10/2007 | Campbell | |
| 2006/0044878 A1 * | 3/2006 | Perner ....................... | 365/189.01 |
| 2006/0118848 A1 | 6/2006 | Kozicki | |
| 2008/0173916 A1 * | 7/2008 | Nishihara ..................... | 257/298 |

OTHER PUBLICATIONS

U.S. Appl. No. 12/123,685, filed May 20, 2008, Xuguang Wang.
Kozicki et al., Nanoscale Memory Elements Based on Solid-State Electrolytes, IEEE Transactions on Nanotechnology, vol. 4, No. 3, May 2005, pp. 331-338.
Eitan et al., NROM: A Novel Localized Trapping, 2-Bit Nonvolatile Memory Cell, IEEE Electron Device Letters, vol. 21, No. 11, Nov. 2000, pp. 543-545.
Kozicki et al., Mass Transport in Chalcogenide Electrolyte Films-Materials and Applications, Journal of Non-Crystalline Solids 354 (2006), pp. 567-577.

* cited by examiner

*Primary Examiner* — Ngan Ngo
*Assistant Examiner* — Benjamin Tzu-Hung Liu
(74) *Attorney, Agent, or Firm* — Campbell Nelson Whipps LLC

(57) ABSTRACT

Non-volatile memory with programmable capacitance is disclosed. Illustrative data memory units include a substrate including a source region and a drain region. A first insulating layer is over the substrate. A second insulating layer is over the substrate and between the source region and drain region. A solid electrolyte layer is between the first insulating layer and second insulating layer. The solid electrolyte layer has a capacitance that is controllable between at least two states. A first electrode is electrically coupled to a first side of the solid electrolyte layer and is electrically coupled to a voltage source. A second electrode is electrically coupled to a second side of the solid electrolyte layer and is electrically coupled to the voltage source. Multi-bit memory units are also disclosed.

13 Claims, 6 Drawing Sheets

US 7,977,722 B2

NON-VOLATILE MEMORY WITH PROGRAMMABLE CAPACITANCE

BACKGROUND

Nonvolatile memory is a type of memory that retains stored data when power is removed from the memory. There are various types of nonvolatile memories including e.g., flash memory.

Flash memory cells make use of a floating-gate covered with an insulating layer. There is also a control gate which overlays the insulating layer. Below the floating gate is another insulating layer sandwiched between the floating gate and the cell substrate. This insulating layer is an oxide layer and is often referred to as the gate oxide or tunnel oxide. The substrate contains doped source and drain regions, with a channel region disposed between the source and drain regions. The floating-gate transistors generally include n-channel floating-gate field-effect transistors, but may also include p-channel floating-gate field-effect transistors. Access operations are carried out by applying biases to the transistor.

In a flash memory device, cells are often organized into blocks and the charge state of the floating gate indicates the logical state of the cell. For example, a charged floating gate may represent a logical "1" while a non-charged floating gate may represent a logical "0." A flash memory cell may be programmed to a desired state by first erasing the cell to a logical "0" and, if necessary, writing the cell to a logical "1." Typically, flash memory devices are organized so that a write operation can target a specific cell while an erase operation affects an entire block of cells. Changing any portion of one block therefore requires erasing the entire block and writing those bits in the block which correspond to a logical "1".

The charge stored on the floating gate is prone to leaking thus affecting the data memory retention and endurance of the flash memory device. In addition, dual-bit or multi-bit flash memory cells have been studied to aid in increasing the memory density without physically reducing the scale of the memory cells. These memory cells can suffer from slow programming erase speed, degraded reliability due to memory window and electron/hole charge center mismatch. In addition, passing electrons thorough the gate oxide layer of the gate during the program, erase, and reading operation degrade the lifetime of the memory cell.

BRIEF SUMMARY

The present disclosure relates to non-volatile memory having a programmable capacitance. In particular, the memory can have its threshold voltage changed by changing the capacitance of the memory gate stack. One approach to changing the capacitance of the memory gate stack is to utilize electrochemical reactions to build or break metal dendrites in a solid electrolyte layer within the gate stack without passing current through a gate oxide layer of the gate stack. Particular memory unit architectures including this solid electrolyte layer are disclosed.

In one particular embodiment, a data memory unit include a substrate having a source region and a drain region. A first insulating layer is over the substrate. A second insulating layer is over the substrate and between the source region and drain region. A solid electrolyte layer is between the first insulating layer and second insulating layer. The solid electrolyte layer has a capacitance that is controllable between at least two states. An anode is electrically coupled to a first side of the solid electrolyte layer and is electrically coupled to a voltage source. A cathode is electrically coupled to a second side of the solid electrolyte layer. The cathode is electrically coupled to the voltage source and the second side opposes the first side.

In another particular embodiment, a memory unit includes a substrate having a source region and a drain region. An insulating layer is over the substrate. A gate contact layer is over the substrate and between the source region and drain region. The gate contact layer is electrically coupled to a voltage source. A solid electrolyte layer is between the insulating layer and the gate contact layer. The solid electrolyte layer has a capacitance that is controllable between at least two states. A first electrode layer is disposed between the solid electrolyte layer and the gate contact layer. The first electrode layer is electrically coupled to the gate contact layer. A second electrode layer is disposed between the solid electrolyte layer and the insulating layer. The second electrode layer is electrically coupled to the voltage source.

In another particular embodiment, a data memory unit includes a substrate having a source region and a drain region. A first insulating layer is over the substrate. A gate contact layer is over the substrate and between the source region and drain region. The gate contact layer is electrically coupled to a voltage source. A second insulating layer is over the substrate and between the source region and drain region. The second insulating layer is disposed between the gate contact layer and the first insulating layer. A solid electrolyte layer is between the first insulating layer and second insulating layer. The solid electrolyte layer has a capacitance that is controllable between at least two states. The solid electrolyte layer is separated into a first region and a second region by a first electrode. The first electrode is electrically coupled to the first region and the second region. A second electrode is electrically coupled to the first region of the solid electrolyte layer. The first region being between the second electrode and the first electrode. The second electrode is electrically coupled to the voltage source. A third electrode is electrically coupled to the second region of the solid electrolyte layer. The second region is between the third electrode and the first electrode, and the third electrode is electrically coupled to the voltage source.

BRIEF DESCRIPTION OF THE DRAWINGS

The disclosure may be more completely understood in consideration of the following detailed description of various embodiments of the invention in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to non-volatile memory having a programmable capacitance. In particular, the memory can have its threshold voltage changed by changing the capacitance, resistance, or conductivity (hereinafter referred to as capacitance) of the memory gate stack. One approach to changing the capacitance of the memory gate stack is to utilize electrochemical reactions to build or break metal dendrites in a solid electrolyte layer within the gate stack without passing current through a gate oxide layer of the gate stack. Particular memory unit architectures including this solid electrolyte layer are disclosed. The non-volatile memory units described herein can replace traditional memory units such as, for example, FLASH memory. While the present invention is not so limited, an appreciation of various aspects of the invention will be gained through a discussion of the examples provided below.

Figure 1:
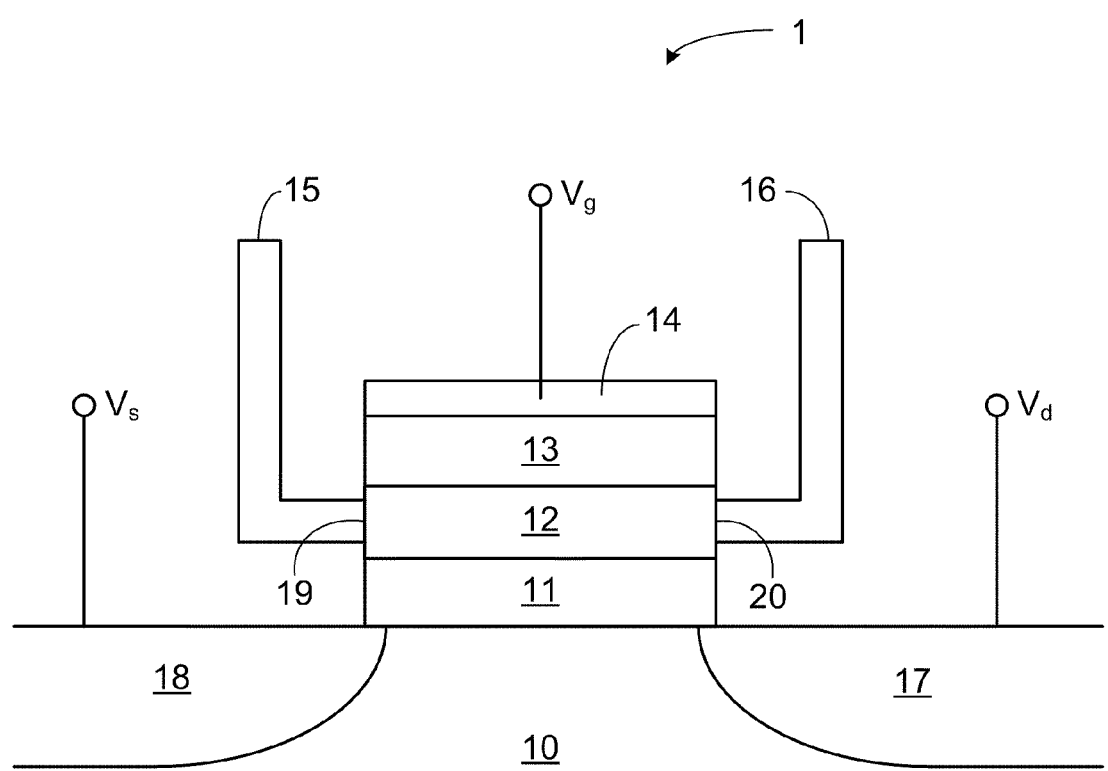
FIG. 1 is a schematic cross-sectional diagram of an illustrative non-volatile memory unit having programmable capacitance.

FIG. 1 is a schematic cross-sectional diagram of an illustrative non-volatile memory unit 10 having programmable capacitance. The non-volatile memory unit 1 includes a substrate 10 including a source region 18 and a drain region 17. The substrate 10 can be formed of any useful material such as, for example, a semiconductor material. In many embodiments, the source region 18 and a drain region 17 are doped to have a n- or p-type conductivity within an different n- or p-type conductivity substrate 10. The source region 18 and a drain region 17 are formed adjacent to a gate stack as conductive regions having a conductivity type that is different than the conductivity type of the substrate 10. For example, the source region 18 and drain region 17 are n-type regions formed by implantation and/or diffusion of n-type dopants, such as arsenic or phosphorus. The edges of the source region 18 and drain region 17 can be generally made to coincide with, or underlap, the gate stack edges. The source region 18 can be electrically coupled to a source voltage $V_s$ (via a source line) and the drain region 17 can be electrically coupled to a source voltage $V_d$ (via a bit line or word line).

The memory unit 1 has a gate stack configuration where the gate stack includes a first insulating layer 11 over the substrate 10, a second insulating layer 13 over the substrate 10 and between the source region 18 and drain region 17, a solid electrolyte layer 12 between the first insulating layer 11 and second insulating layer 13. The solid electrolyte layer 12 has a capacitance that is controllable between at least two states. An anode 15 is electrically coupled to a first side 19 of the solid electrolyte layer 12. The anode 15 is electrically coupled to a voltage source. A cathode 16 is electrically coupled to a second side 20 of the solid electrolyte layer 12. The cathode 16 is electrically coupled to the voltage source and the second side 20 opposes the first side 19.

The memory unit 1 includes a gate contact layer 14 disposed proximate to the second insulating layer 13. The gate contact layer 14 is in electrical communication with a gate voltage source $V_g$ (via a word line or bit line). In many embodiments, the first insulating layer 11 can also be referred to as the gate oxide layer.

The elements of the memory unit 1 can be formed using conventional semiconductor fabrication techniques. The memory unit 1 can include one or more additional layers (not shown) or such as barrier layers (e.g., tantalum nitride) between the solid electrolyte layer 12 and the insulating layer 11 and 13, or side wall elements (not shown) such as, for example, insulating sidewalls formed by blanket deposition of an insulating material. The insulating layers can be formed of any useful insulating material such as, for example, silicon oxide, silicon nitride, or silicon oxynitride.

The solid electrolyte layer 12 is sandwiched between the anode 15 and the cathode 16. In many embodiments, the anode 15 and the cathode 16 extend out of the gate stack. The solid electrolyte layer 12 is capable of being switched from a first logic state to a second logic state. The solid electrolyte layer 12 uses electrochemical reaction to build or break metal dendrites in the solid electrolyte layer 12. The memory unit 1 voltage threshold can be changed between a high and low voltage threshold to determine if the memory unit 1 has a first logic state to a second logic state.

In many embodiments the solid electrolyte layer 12 includes a chalcogenide material. In some embodiments the chalocogenide material is germanium-selenide ($Ge_xSe_{100-x}$) containing a silver (Ag) component. One method of providing silver to a germanium-selenide composition is to form a germanium-selenide glass and then deposit a thin layer of silver upon the glass, for example by sputtering, physical vapor deposition, or other known techniques in the art. The layer of silver is irradiated with electromagnetic energy, so that the energy passes through the silver and to the silver/glass interface, to break a chalcogenide bond of the chalcogenide material such that the glass is doped or photodoped with silver. Another method for providing silver to the glass is to provide a layer of silver-selenide on a germanium-selenide glass.

Placing the solid electrolyte layer 12 in direct contact with and between the anode 15 and cathode 16, where one of the anode 15 or cathode 16 includes an electrochemically active material (i.e., metal) and the other of the anode 15 or cathode 16 is an electrochemically inert material (i.e., metal), allows the solid electrolyte layer 12 to be switched between a high resistance state and a low resistance state, via application of a voltage across the anode 15 and cathode 16. Switching the solid electrolyte layer 12 between a high resistance state and a low resistance state is further described below.

Figure 2:
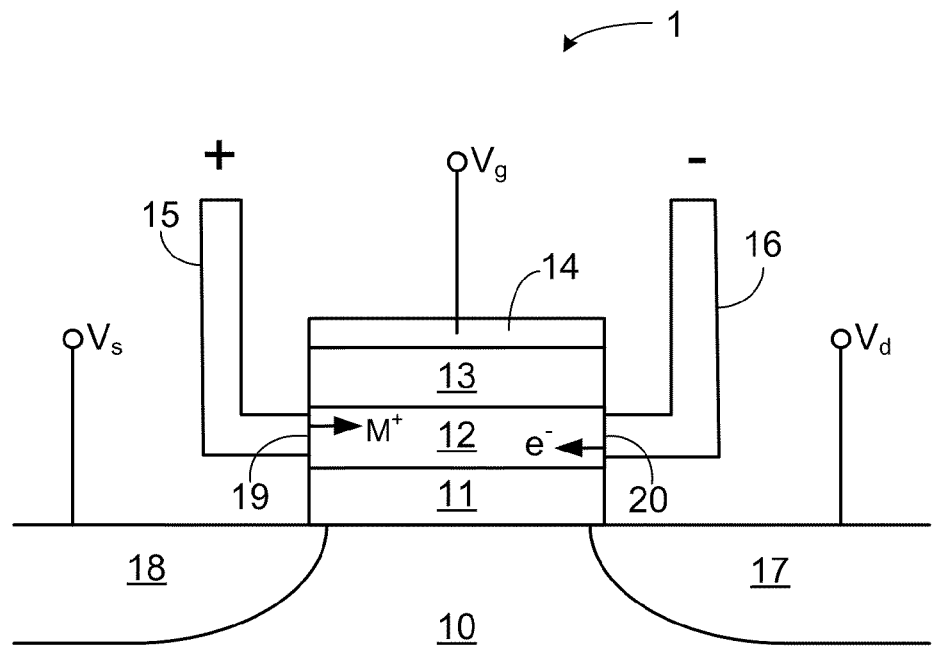
FIG. 2 is a schematic cross-sectional diagram of an exemplary non-volatile memory unit shown in FIG. 1 during a programming operation.
Figure 3:
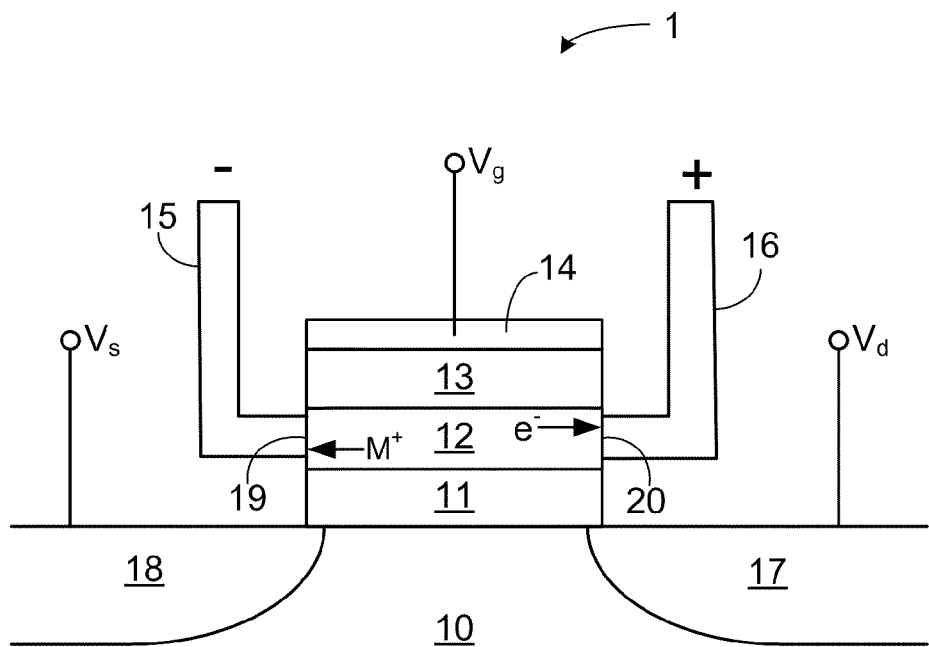
FIG. 3 is a schematic cross-sectional diagram of an exemplary non-volatile memory unit shown in FIG. 1 during an erase operation.

FIG. 2 is a schematic cross-sectional diagram of an exemplary non-volatile memory unit 1 shown in FIG. 1 during a programming operation. FIG. 3 is a schematic cross-sectional diagram of an exemplary non-volatile memory unit 1 shown in FIG. 1 during an erase operation. In the illustrated embodiments, the anode 15 is formed of an electrochemically active material (e.g., copper, silver, tin) and the cathode 16 is formed of an electrochemically inert material (e.g., platinum, nickel, tantalum). In other embodiments, the cathode 16 is formed of an electrochemically active material and the anode 15 is formed of an electrochemically inert material.

As illustrated in FIG. 2, a forward bias is applied between the anode 15 and the cathode 16 to program the memory unit 1. An oxidation reaction ($M \rightarrow M^+ + e^-$) occurs at the electrochemically active metal (M) anode 15 solid electrolyte layer 12 interface 19 supplying metal ions $M^+$ into the solid electrolyte layer 12 and the cathode 16 supplies electrons $e^-$ into the solid electrolyte layer 12. In the solid electrolyte layer 12 the supplied metal ions $M^+$ and electrons $e^-$ undergo a reduction reaction ($M^+ + e^- \rightarrow M$) and metal dendrites grow in the solid electrolyte layer 12. This metal dendrite growth changes (increases) the capacitance (thus increasing the conductivity) of the solid electrolyte layer 12 and decreasing a threshold voltage of the gate stack or memory unit 1. This programming operation is accomplished without passing electrons or an electrical current through the gate oxide layer 11 or the gate contact layer 14. Programming the solid electrolyte layer 12 can be accomplished with: a voltage of one Volt or less, or 500 mV or less, or 300 mV or less; at a speed of 30 ns or less, or 20 ns or less, or 10 ns or less; with a power consumption of 2 pJ or less, or 1 pJ or less.

As illustrated in FIG. 3, a reverse bias is applied between the anode 15 and the cathode 16 to erase the memory unit 1. Metal dendrites in the solid electrolyte layer 12 are oxidized and dissolved into metal ions $M^+$. At the anode 15 solid electrolyte layer 12 interface 19 metal ions $M^+$ react with electrons $e^-$ and metal (M) is deposited onto the anode 15 decreasing the conductivity of the solid electrolyte layer 12. The capacitance of the solid electrolyte layer 12 changes back to the state before programming. This erase operation is accomplished without passing electrons or an electrical current through the gate oxide layer 11 or the gate contact layer 14. Erasing the solid electrolyte layer 12 can be accomplished with: a voltage of one Volt or less, or 500 mV or less, or 300 mV or less; at a speed of 30 ns or less, or 20 ns or less, or 10 ns or less; with a power consumption of 2 pJ or less, or 1 pJ or less.

Changing the solid electrolyte layer 12 capacitance results in a capacitance of the gate stack changing. When the memory unit 1 is programmed, metal dendrites grow in the solid electrolyte layer 12 and the capacitance of the solid electrolyte layer 12 increases. Hence, the capacitance of the gate stack is increased and the corresponding voltage threshold $V_T$ of the memory unit 1 decreases. Since both the program and erase operation does not pass electrons or current though either the gate contact layer 14 or the gate oxide layer 11, and since there are no stored charges to leak from the memory unit, the lifetime and endurance of the memory unit 1 is improved over typical FLASH or SONOS memories.

The read operation is similar to typical FLASH or SONOS memories. A reading voltage $V_g$ is placed on the gate contact 14 of the memory unit 1 so that electrical current flows in the programmed units but not the erased units. The presence or absence of electrical current (due to the change in the memory unit voltage threshold) is sensed and translated into 1s (i.e., first logic state) or 0s (i.e., second logic state).

Figure 4:
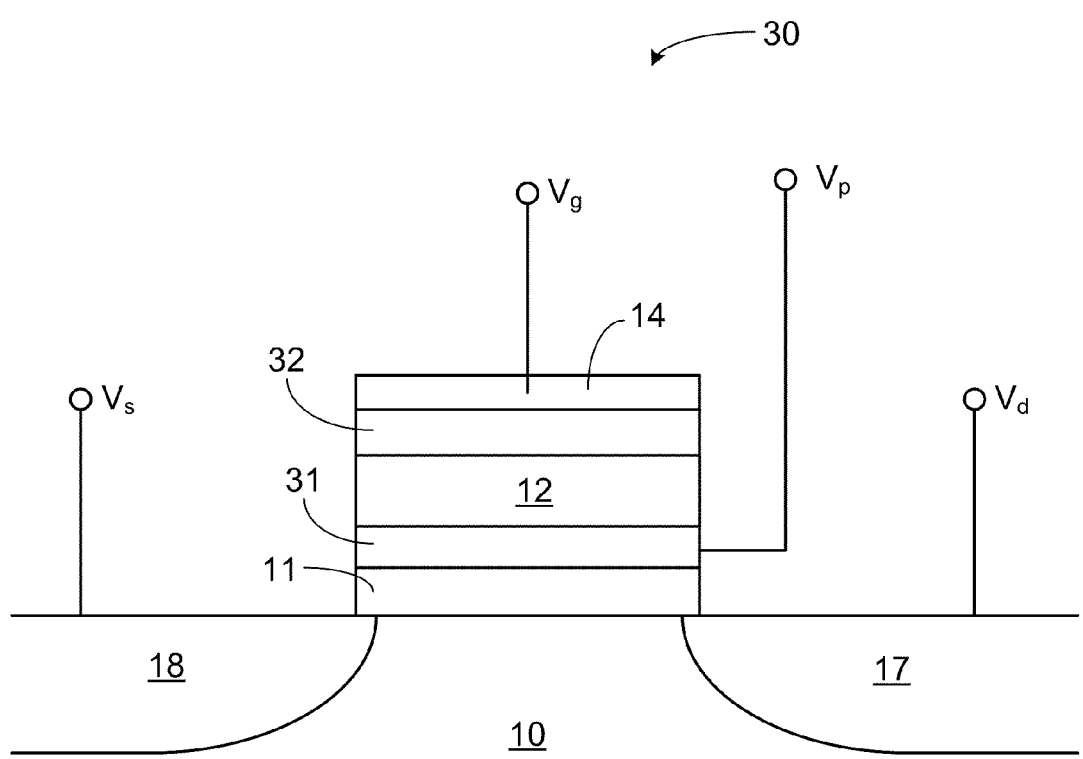
FIG. 4 is a schematic cross-sectional diagram of another illustrative non-volatile memory unit having programmable capacitance.

FIG. 4 is a schematic cross-sectional diagram of another illustrative non-volatile memory unit 30 having programmable capacitance. The non-volatile memory unit 30 includes a substrate 10 including a source region 18 and a drain region 17, as described above. The source region 18 can be electrically coupled to a source voltage $V_s$ (via a source line) and the drain region 17 can be electrically coupled to a source voltage $V_d$ (via a bit line or word line).

The memory unit 30 has a gate stack configuration where the gate stack includes a insulating layer 11 over the substrate 10, a gate contact layer 14 over the substrate 10 and between the source region 18 and drain region 17, a solid electrolyte layer 12 between the insulating layer 11 and the gate contact layer 14. The gate contact layer 14 is electrically coupled to a gate voltage source $V_g$ (via a bit line or word line). The solid electrolyte layer 12 has a capacitance that is controllable between at least two states. A first electrode layer 32 is between the solid electrolyte layer 12 and the gate contact layer 14. The first electrode layer 32 is electrically coupled to the gate contact layer 14 and the solid electrolyte layer 12. A second electrode layer 31 is between the solid electrolyte layer 12 and the insulating layer 11 and electrically coupled to the solid electrolyte layer 12 and a voltage source $V_p$. In many embodiments, the first insulating layer 11 can also be referred to as the gate oxide layer.

The elements of the memory unit 30 can be formed using conventional semiconductor fabrication techniques. The memory unit 30 can include one or more additional layers (not shown) or such as barrier layers (e.g., tantalum nitride) between the solid electrolyte layer 12 and the insulating layer 11, or side wall elements (not shown) such as, for example, insulating sidewalls formed by blanket deposition of an insulating material. The insulating layers can be formed of any useful insulating material such as, for example, silicon oxide, silicon nitride, or silicon oxynitride.

The solid electrolyte layer 12 is sandwiched between the first electrode layer 32 and the second electrode layer 31. In many embodiments, the second electrode layer 31 extends out of the gate stack. The solid electrolyte layer 12 is capable of being switched from a first logic state to a second logic state. The solid electrolyte layer 12 uses electrochemical reaction to build or break metal dendrites in the solid electrolyte layer 12. The memory unit 30 voltage threshold can be changed between a high and low voltage threshold to determine if the memory unit 30 has a first logic state to a second logic state.

In many embodiments the solid electrolyte layer 12 includes a chalcogenide material, as described above. Placing the solid electrolyte layer 12 in direct contact with and between the first electrode layer 32 and the second electrode layer 31, where one of the first electrode layer 32 and the second electrode layer 31 includes an electrochemically active material (i.e., metal) and the other of the first electrode layer 32 and the second electrode layer 31 is an electrochemically inert material (i.e., metal), allows the solid electrolyte layer 12 to be switched between a high resistance state and a low resistance state, via application of a voltage across the first electrode layer 32 and the second electrode layer 31.

Switching the solid electrolyte layer 12 between a high resistance state and a low resistance state is further described below.

Figure 5:
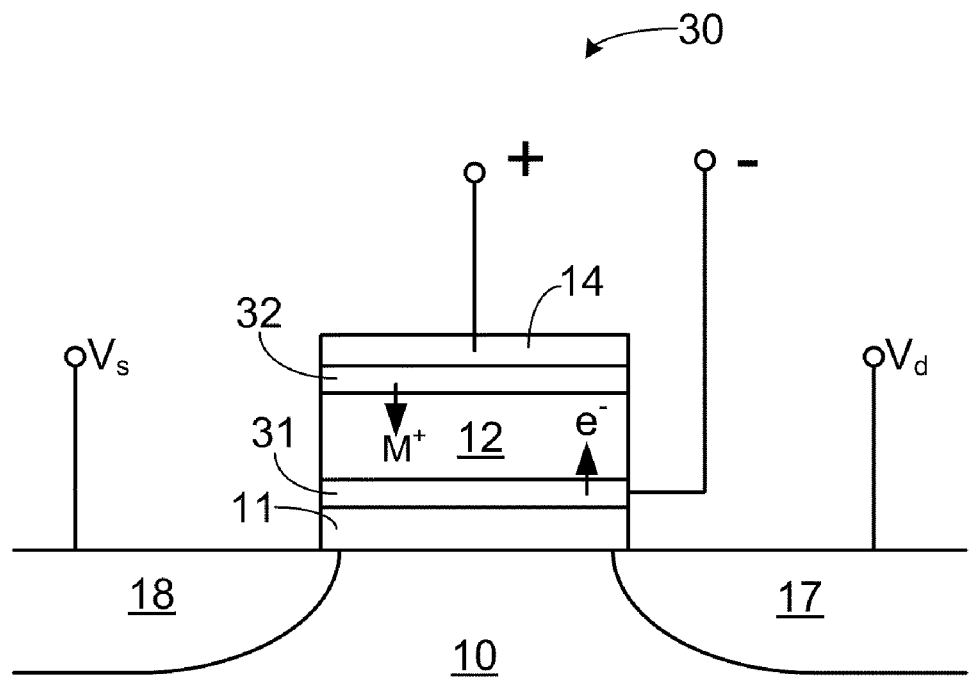
FIG. 5 is a schematic cross-sectional diagram of an exemplary non-volatile memory unit shown in FIG. 4 during a programming operation.
Figure 6:
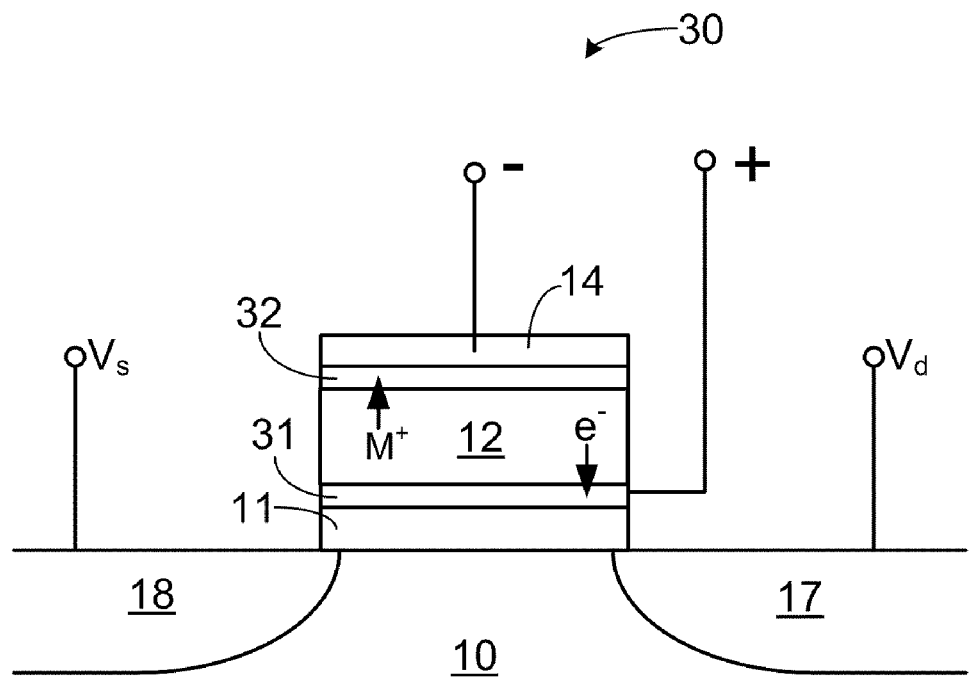
FIG. 6 is a schematic cross-sectional diagram of an exemplary non-volatile memory unit shown in FIG. 4 during an erase operation.

FIG. 5 is a schematic cross-sectional diagram of an exemplary non-volatile memory unit 30 shown in FIG. 4 during a programming operation. FIG. 6 is a schematic cross-sectional diagram of an exemplary non-volatile memory unit 30 shown in FIG. 4 during an erase operation. In the illustrated embodiments, the first electrode layer 32 is formed of an electrochemically active material (e.g., copper, silver, tin) and the second electrode layer 31 is formed of an electrochemically inert material (e.g., platinum, nickel, tantalum). In other embodiments, the second electrode layer 31 is formed of an electrochemically active material and the first electrode layer 32 is formed of an electrochemically inert material.

As illustrated in FIG. 5, a forward bias is applied between the first electrode layer 32 and the second electrode layer 31 to program the memory unit 30. An oxidation reaction ($M \rightarrow M^+ + e^-$) occurs at the electrochemically active metal (M) first electrode layer 32 solid electrolyte layer 12 interface 19 supplying metal ions $M^+$ into the solid electrolyte layer 12 and the second electrode layer 31 supplies electrons $e^-$ into the solid electrolyte layer 12. In the solid electrolyte layer 12 the supplied metal ions $M^+$ and electrons $e^-$ undergo a reduction reaction ($M^+ + e^- \rightarrow M$) and metal dendrites grow in the solid electrolyte layer 12. This metal dendrite growth changes (increases) the capacitance (thus increasing the conductivity) of the solid electrolyte layer 12 and decreasing a threshold voltage of the gate stack or memory unit 30. This programming operation is accomplished without passing electrons or an electrical current through the gate oxide layer 11 or the gate contact layer 14. Programming the solid electrolyte layer 12 can be accomplished with: a voltage of one Volt or less, or 500 mV or less, or 300 mV or less; at a speed of 30 ns or less, or 20 ns or less, or 10 ns or less; with a power consumption of 2 pJ or less, or 1 pJ or less.

As illustrated in FIG. 6, a reverse bias is applied between the first electrode layer 32 and the second electrode layer 31 to erase the memory unit 10. Metal dendrites in the solid electrolyte layer 12 are oxidized and dissolved into metal ions $M^+$. At the first electrode layer 32 solid electrolyte layer 12 interface metal ions $M^+$ react with electrons $e^-$ and metal (M) is deposited onto the first electrode layer 32. The capacitance of the solid electrolyte layer 12 changes back to the state before programming. This erase operation is accomplished without passing electrons or an electrical current through the gate oxide layer 11 or the gate contact layer 14. Erasing the solid electrolyte layer 12 can be accomplished with: a voltage of one Volt or less, or 500 mV or less, or 300 mV or less; at a speed of 30 ns or less, or 20 ns or less, or 10 ns or less; with a power consumption of 2 pJ or less, or 1 pJ or less.

Changing the solid electrolyte layer 12 capacitance results in a capacitance of the gate stack changing. When the memory unit 10 is programmed, metal dendrites grow in the solid electrolyte layer 12 and the capacitance of the solid electrolyte layer 12 increases. Hence, the capacitance of the gate stack is increased and the corresponding voltage threshold $V_T$ of the memory unit 10 decreases. Since both the program and erase operation does not pass electrons or current though either the gate contact layer 14 or the gate oxide layer 11, and since there are no stored charges to leak from the memory unit, the lifetime and endurance of the memory unit 10 is improved over typical FLASH or SONOS memories.

The read operation is similar to typical FLASH or SONOS memories. A reading voltage $V_g$ is placed on the gate contact 14 of the memory unit 10 so that electrical current flows in the programmed units but not the erased units. The presence or absence of electrical current (due to the change in the memory cell voltage threshold) is sensed and translated into 1s (i.e., first logic state) or 0s (i.e., second logic state).

Figure 7:
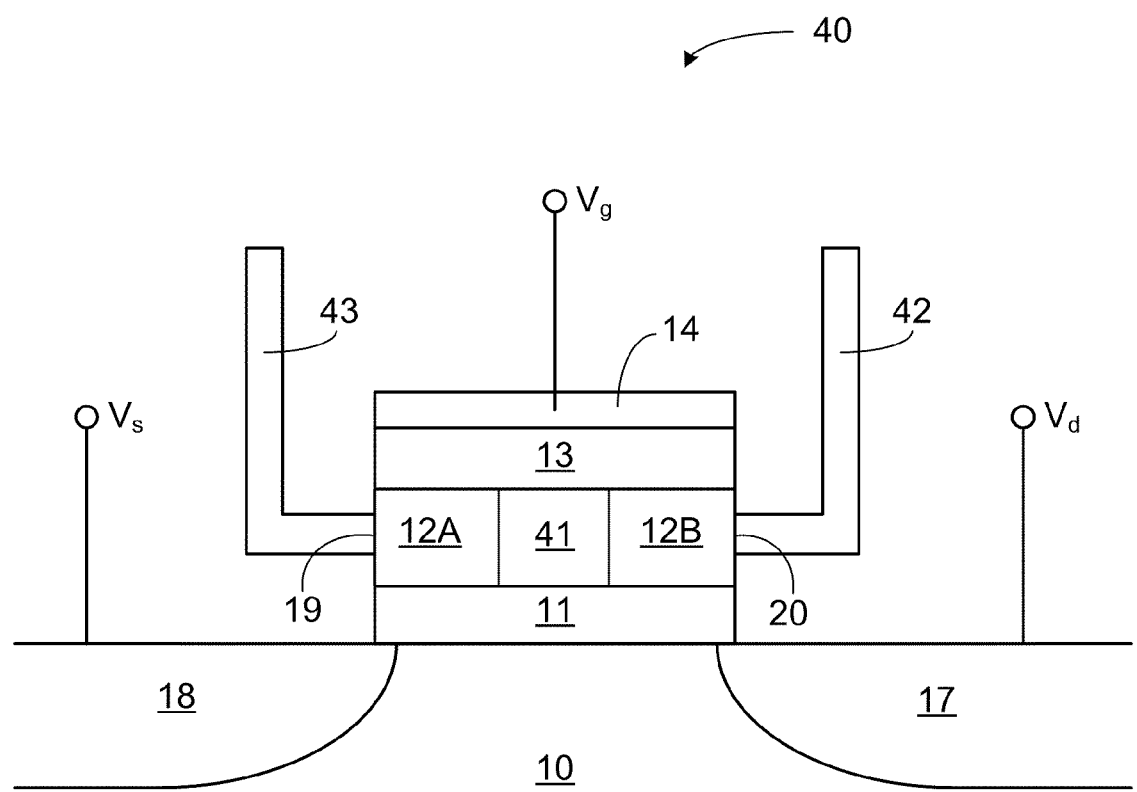
FIG. 7 is a schematic cross-sectional diagram of another illustrative non-volatile memory unit having programmable capacitance.

FIG. 7 is a schematic cross-sectional diagram of another illustrative non-volatile memory unit 40 having programmable capacitance. The non-volatile memory unit 40 includes a substrate 10 including a source region 18 and a drain region 17, as described above. The source region 18 can be electrically coupled to a source voltage $V_s$ (via a source line) and the drain region 17 can be electrically coupled to a source voltage $V_d$ (via a bit line or word line).

The memory unit 40 has a gate stack configuration where the gate stack includes a first insulating layer 11 over the substrate 10, a second insulating layer 13 over the substrate 10 and between the source region 18 and drain region 17, a solid electrolyte layer 12A, 12B between the first insulating layer 11 and second insulating layer 13, and a gate contact layer 14 is over the substrate 10 and between the source region 18 and drain region 17. A gate contact layer 14 is electrically coupled to a voltage source $V_g$ (via a word line or a bit line). The second insulating layer 13 is between the gate contact layer 14 and the first insulating layer 11.

Each solid electrolyte layer 12A, 12B has a capacitance that is controllable between at least two states (e.g., high and low capacitance level). The solid electrolyte layer 12A, 12B is separated into a first region 12A and a second region 12B by a third electrode 41. The third electrode 41 is electrically coupled to the first region 12A and the second region 12B. The third electrode 41, first region 12A, and the second region 12B are sandwiched between the first insulating layer 11 and second insulating layer 13. In many embodiments, the third electrode 41, first region 12A, and the second region 12B form a coplanar layer between the first insulating layer 11 and second insulating layer 13. In many embodiments, the third electrode 41 is capacitively coupled to the gate contact layer 14. In some embodiments, the third electrode 41 is directly electrically connected to a voltage source.

A second electrode 43 is electrically coupled to the first region 12A of the solid electrolyte layer. The first region 12A is between the second electrode 43 and the third electrode 41. The second electrode 43 is electrically coupled to a voltage source for program and erase operation of the first region 12A. The second electrode 43 contacts the first region 12A at a first side 19 of the solid electrolyte layer.

A first electrode 42 is electrically coupled to the second region 12B of the solid electrolyte layer. The second region 12B is between the first electrode 42 and the third electrode 41. The first electrode 42 is electrically coupled to a voltage source for program and erase operation of the second region 12B. The first electrode 42 contacts the first region 12B at a second side 20 of the solid electrolyte layer. The first side 19 opposes the second side 20.

In many embodiments, the first insulating layer 11 can also be referred to as the gate oxide layer. The elements of the memory unit 40 can be formed using conventional semiconductor fabrication techniques. The memory unit 40 can include one or more additional layers (not shown) or such as barrier layers (e.g., tantalum nitride) between the solid electrolyte layer 12A, 12B and the insulating layer 11 and 13, or side wall elements (not shown) such as, for example, insulating sidewalls formed by blanket deposition of an insulating material. The insulating layers can be formed of any useful insulating material such as, for example, silicon oxide, silicon nitride, or silicon oxynitride.

In many embodiments, the second electrode 43 and the first electrode 42 extend out of the gate stack. Each of the first region 12A and the second region 12B of the solid electrolyte layer is capable of being independently switched from a first logic state (e.g., "1") to a second logic state (e.g., "0"). Thus, this multi-bit memory unit 40 has four states (e.g., "11", "00", "10", and "01") where each bit can be independently read during the read operation (i.e., reverse read operation, described below). Each of the first region 12A and the second region 12B of the solid electrolyte layer uses electrochemical reaction to build or break metal dendrites in the solid electrolyte layer 12. The memory unit 40 voltage threshold can be changed between voltage threshold levels to determine if the memory unit 40 has a first logic state (e.g., "11"), second logic state (e.g., "00"), third logic state (e.g., "10"), or fourth logic state (e.g., "01").

In many embodiments the solid electrolyte layer 12A, 12B includes a chalcogenide material, as described above. Placing the solid electrolyte layer first region 12A in direct contact with and between the second electrode 43 and the third electrode 41 where one of the second electrode 43 or the third electrode 41 includes an electrochemically active material (i.e., metal) and the other of the second electrode 43 or the third electrode 41 is an electrochemically inert material (i.e., metal), allows the solid electrolyte layer first region 12A to be switched between a high resistance state and a low resistance state, via application of a voltage across the second electrode 43 and the third electrode 41. Placing the solid electrolyte layer second region 12B in direct contact with and between the first electrode 42 and the third electrode 41 where one of the first electrode 42 or the third electrode 41 includes an electrochemically active material (i.e., metal) and the other of the first electrode 42 or the third electrode 41 is an electrochemically inert material (i.e., metal), allows the solid electrolyte layer second region 12B to be switched between a high resistance state and a low resistance state, via application of a voltage across the first electrode 42 and the third electrode 41.

The solid electrolyte layer first region 12A can be described as a first bit 12A and the solid electrolyte layer second region 12B can be described as a second bit 12A, together forming a dual bit memory unit 40. A gate bias can be applied and capacitively coupled to the third electrode 41. The first bit 12A or second bit 12B can be individually selected (i.e., programmed) by the second electrode 43 or first electrode 42 and the solid electrolyte material of the selected bit can be switched from a high resistance dielectric to a low resistance metal, as described in the program/erase operations above. To avoid a disturbance of the non-selected bit, a bias about equal to the center gate is applied to the unselected bit side electrode. The erase operation bias configuration is similar to the programming operation but the applied bias across the selected bit is reversed. The program and erase operations utilize the same oxidation and reduction reactions to form or break metal dendrites, as described above.

The programming and erase operation are accomplished without passing electrons or an electrical current through the gate oxide layer 11 or the gate contact layer 14. The program and erase operation can be accomplished with: a voltage of one Volt or less, or 500 mV or less, or 300 mV or less; at a speed of 30 ns or less, or 20 ns or less, or 10 ns or less; with a power consumption of 2 pJ or less, or 1 pJ or less.

Changing the first bit 12A and/or second bit 12B capacitance results in a capacitance of the gate stack changing. When the dual-bit memory unit 40 is programmed, metal dendrites grow in the selected first bit 12A and/or second bit 12B and the capacitance of the selected first bit 12A and/or second bit 12B increases. Hence, the capacitance of the gate stack is increased and the corresponding voltage threshold $V_T$ of the memory unit 40 decreases. Since both the program and erase operation does not pass electrons or current though either the gate contact layer 14 or the gate oxide layer 11, and since there are no stored charges to leak from the memory unit, the lifetime and endurance of the memory unit 40 is improved over typical FLASH or SONOS memories.

The read operation can be described as a reverse read scheme. A reverse read scheme refers to reading in a direction opposite to that of programming. For example, to read the first bit 12A a drain voltage $V_d$ (for example 1.5 V) is applied on the drain region 17, the source region 18 is grounded ($V_s=0$), and a gate voltage $V_g$ (for example 1.2 to 3.3 V) is applied to the gate contact layer 14. A depletion region (along the substrate 10 drain region 17 interface) will screen the second bit 12B effect on the threshold voltage. The gate current is mainly determined by the injected carriers from the detected bit 12A side and thus can tell the state of the first bit 12A. Reading the second bit 12B is accomplished in the same manner except that the a source voltage $V_s$ (for example 1.5 V) is applied to the source region 18 and the drain region 17 is grounded. A depletion region (along the substrate 10 drain region 17 interface) will screen the first bit 12A effect on the threshold voltage due to the second bit 12B, as described above. In this scheme the voltage for the second electrode 43 and third electrode 42 are selected to avoid any disturbance during the reading operation.

Compared to conventional dual-bit memory units which uses electron/hole charges to change the threshold voltage, this memory unit 40 uses the gate capacitance to alter the threshold voltage. One illustrative advantage of this memory unit 40 is that the change in capacitance can be precisely controlled and is determined by the relative size of the programmable layer 12A, 12B not by the electron/hole distribution. Therefore, the neighboring bits disturbance effect can be minimized by designing the center or third electrode 41 and the first bit 12A and second bit 12B layer dimensions. Also, since there is no two carrier injection in this memory unit, it is more immune to reliability concerns introduced by mismatch of electron/hole charge centers.

Figure 8:
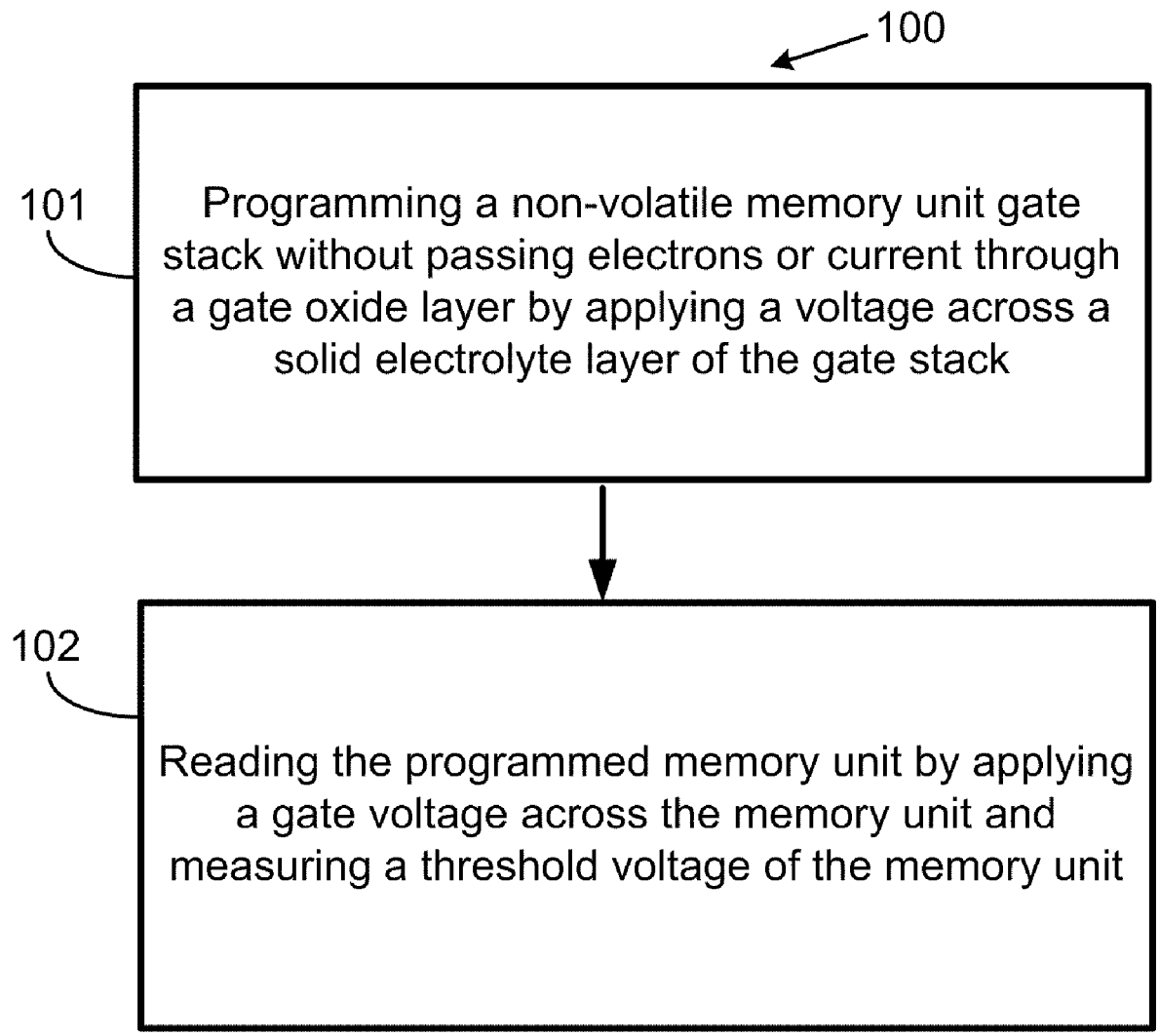
FIG. 8 is an illustrative flow diagram of a programming operation and reading operation for the illustrative non-volatile memory unit having programmable capacitance.

FIG. 8 is an illustrative flow diagram 100 of a programming operation and reading operation for the illustrative non-volatile memory unit having programmable capacitance. Block 101 provides the programming of a non-volatile memory unit gate stack without passing electrons or current through a gate oxide layer by applying a voltage across a solid electrolyte layer of the gate stack. In some embodiments, the programming step 101 builds metal dendrites within a solid electrolyte layer, as described above, and reduces the resistance of the gate stack. In some embodiments, the programming step 101 breaks down metal dendrites within a solid electrolyte layer, as described above, and increase the resistance of the gate stack. Block 102 provides reading the programmed memory unit by applying a gate voltage across the memory unit and measuring a threshold voltage of the memory unit.

Thus, embodiments of the NON-VOLATILE MEMORY WITH PROGRAMMABLE CAPACITANCE are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A data memory unit, comprising:
a substrate including a source region and a drain region;
a first insulating layer over the substrate;
a second insulating layer over the substrate and between the source region and drain region;

a solid electrolyte layer between the first insulating layer and second insulating layer, the solid electrolyte layer has a capacitance that is controllable between at least two states;

an anode electrically coupled to a first side of the solid electrolyte layer, the anode electrically coupled to a voltage source; and a cathode electrically coupled to a second side of the solid electrolyte layer, the cathode electrically coupled to the voltage source and the second side opposing the first sides;

wherein the first insulating layer, second insulating layer, and solid electrolyte layer form a gate stack, and the anode or cathode extends out of the gate stack.

2. A data memory unit according to claim 1, wherein the first insulating layer, second insulating layer, and solid electrolyte layer form a gate stack, and the anode extends out of the gate stack and the cathode extends out of the gate stack.

3. A data memory unit according to claim 1, further comprising a barrier layer disposed between the solid electrolyte layer and the first insulating layer, the barrier layer configured to reduce metal diffusion into the first insulating layer.

4. A data memory unit according to claim 1, wherein the solid electrolyte layer capacitance is controlled by building or breaking metal dendrites within the solid electrolyte layer.

5. A data memory unit according to claim 1, wherein the cathode comprises an electrochemically active metal and the anode comprises an electrochemically inert material.

6. A data memory unit according to claim 1, wherein the anode comprises an electrochemically active metal and the cathode comprises an electrochemically inert material.

7. A data memory unit according to claim 1, wherein the solid electrolyte layer capacitance is controllable between at least two states with an application of a voltage of 500 millivolts or less across the anode and cathode.

8. A data memory unit, comprising:
a substrate including a source region and a drain region;
a first insulating layer over the substrate;
a gate contact layer over the substrate and between the source region and drain region, the gate contact layer electrically coupled to a voltage source;
a second insulating layer over the substrate and between the source region and drain region, the second insulating layer disposed between the gate contact layer and the first insulating layer;
a solid electrolyte layer between the first insulating layer and second insulating layer, the solid electrolyte layer has a capacitance that is controllable between at least two states, the solid electrolyte layer separated into a first region and a second region by a third electrode, the third electrode electrically coupled to the first region and the second region;
a second electrode electrically coupled to the first region of the solid electrolyte layer, the first region being between the second electrode and the third electrode, the second electrode electrically coupled to the voltage source; and
a first electrode electrically coupled to the second region of the solid electrolyte layer, the second region being between the first electrode and the third electrode, the first electrode electrically coupled to the voltage source.

9. A data memory unit according to claim 8, wherein the first region of the solid electrolyte layer is controllable between at least two states, and the second region of the solid electrolyte layer is controllable between at least two states, and the state of the first region can be different than the state of the second region.

10. A data memory unit according to claim 8, wherein the data memory unit is a dual-bit memory unit and the solid electrolyte layer first region has a first state and the solid electrolyte layer second region has a second state.

11. A data memory unit according to claim 8, wherein the third electrode is formed of an electrochemically active metal and the second and first electrode is formed of an electrochemically inert material.

12. A data memory unit according to claim 8, wherein the second and first electrode is formed of an electrochemically active metal and the third electrode is formed of an electrochemically inert material.

13. A data memory unit according to claim 8, wherein the solid electrolyte layer capacitance is controllable between at least two states with an application of a voltage of one Volt or less across the gate contact layer and either the second electrode or first electrode.

* * * * *